(12) United States Patent
Liang et al.

(10) Patent No.: US 6,211,045 B1
(45) Date of Patent: Apr. 3, 2001

(54) INCORPORATION OF NITROGEN-BASED GAS IN POLYSILICON GATE RE-OXIDATION TO IMPROVE HOT CARRIER PERFORMANCE

(75) Inventors: Victor Liang, Milpitas; Mark Rubin, San Jose; Bijan Moslehi, Stanford, all of CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/452,291

(22) Filed: Nov. 30, 1999

(51) Int. Cl.$^7$ ................................................. H01L 21/4763
(52) U.S. Cl. ..................... 438/585; 438/197; 438/199; 438/584; 438/585; 438/723; 438/724; 257/411; 257/412
(58) Field of Search ..................... 438/584, 585, 438/724, 723, 199, 197; 257/411, 412

(56) References Cited

U.S. PATENT DOCUMENTS

| Re. 34,535 | * | 2/1994 | Paterson et al. ...................... 365/185 |
| 4,002,501 | * | 1/1977 | Tamura ................................. 148/1.5 |
| 4,949,154 | * | 8/1990 | Haken .................................. 357/54 |
| 5,397,720 | * | 3/1995 | Kwong et al. ........................ 437/40 |
| 5,422,291 | * | 6/1995 | Clementi et al. ..................... 437/43 |
| 5,541,141 | * | 7/1996 | Cho ..................................... 437/239 |
| 5,629,221 | * | 5/1997 | Chao et al. ........................... 438/591 |
| 5,840,610 | * | 11/1998 | Gilmer et al. ........................ 438/301 |
| 5,869,405 | * | 2/1999 | Gonzalez et al. .................... 438/770 |
| 5,891,809 | * | 4/1999 | Chau et al. .......................... 438/770 |
| 5,952,706 | * | 9/1999 | Bashir ................................. 257/587 |
| 6,033,998 | * | 3/2000 | Aronowitz et al. .................. 438/786 |
| 6,040,249 | * | 3/2000 | Holloway ............................ 438/769 |
| 6,114,258 | * | 5/2000 | Miner et al. ......................... 438/787 |

OTHER PUBLICATIONS

R.I. Hegde et al. "Growth and surface chemistry of Oxynitride gate dielectric using nitric oxide". Applied Phys. Lett. vol. 66 May 22, 1995.*
J. Ahn et al. "Furnace nitridation of thermal SiO2 in Pure N20 ambient for ULSI mos applications." IEEE Elect. Device Letters vol. 13 No. 2 Feb. 1992.*
H. Hwang "Electrical characteristics of ultrathin oxynitride gate dielectric . . . " Applied Phys. Letters vol. 57 No. 10 Sep. 3, 1990.*
E. Cartier "Atomic hydrogen–induced interface degadation of reoxidized–nitrided silicon dioxide on silicon" Applied Phys. Letters vol. 64 No. 7 Feb. 14, 1994.*
E. P. Gusev, H. C. Lu, E.L. Garfunkel, T. Gustafsson, M. L. Green, Growth and Characterization of Ultrathin Nitrided Silicon Oxide Films, *IBM J. Res. Develop.*, vol. 43 No. 3, May 1999.

* cited by examiner

*Primary Examiner*—Matthew Smith
*Assistant Examiner*—Granvill D. Lee, Jr.
(74) *Attorney, Agent, or Firm*—Douglas L. Weller

(57) ABSTRACT

A method is presented in which nitrogen-based gas in incorporated in polysilicon gate re-oxidation to improve hot carrier performance. A gate oxide layer is formed. Gate material is deposited on the gate oxide layer. The gate material is etched to form a gate structure. The gate oxide layer and the gate are re-oxidized. During re-oxidation, nitrogen-based gas is introduced to nitridize re-oxidized portions of the gate oxide layer.

10 Claims, 3 Drawing Sheets

INCORPORATION OF NITROGEN-BASED GAS IN POLYSILICON GATE RE-OXIDATION TO IMPROVE HOT CARRIER PERFORMANCE

BACKGROUND

The present invention concerns the processing of semiconductor devices and pertains particularly to the incorporation of nitrogen-based gas in polysilicon gate re-oxidation to improve hot carrier performance.

The gate of a metal-oxide-semiconductor (MOS) transistor that is formed using nitridized gate oxide has many benefits. The nitridized gate oxide exhibits superior hot carrier performance as compared to the standard silicon dioxide gate.

Nitridized oxide is formed by incorporating a nitrogen-based gas at the end of an oxidation cycle. The nitrogen-based gas is introduced at the end of the cycle because the growth of nitridized oxide is self-limiting. Once the nitrogen-based gas is introduced, approximately four to five Angstroms (Å) of additional oxide can be grown. After that, no further oxidation is observed under the nitridizing environment. However, reverting to standard oxidation conditions (removing nitrogen-based gas) will allow oxide growth to proceed again.

During the fabrication of a complementary metal-oxide-semiconductor (CMOS) transistor, a slight oxidation can be performed after the polysilicon gate is patterned and etched. For sub-micron technologies, the thickness of this "poly re-oxidation" is on the order of five to ten nanometers (nm). The purpose of the poly re-oxidation is to heal any damage that may have occurred at the gate edge during the plasma etching of the gate. It also serves to act as a passivating layer over silicon and a screen for subsequent dopant implantations.

When polysilicon re-oxidation is performed, additional oxide is grown at the nitridized oxide-silicon interface in areas not covered by the polysilicon gate. Some of this oxide growth will also encroach under the polysilicon gate. In the worst case, there may be no nitridized oxide in the areas not covered by the polysilicon gate because of the combination of polysilicon over etch, along with the enhanced etch rate of the oxide during pre-polysilicon re-oxidation clean due to etch damage. This means that in the immediate vicinity under the gate edge, the oxide at the oxide-silicon interface is now just standard oxide. It is the oxide properties at this gate edge, along with the area that will eventually be under the spacer of the transistor, that will determine the hot carrier performance. Thus the polysilicon re-oxidation can compromise the advantages of using nitridized gate oxide. This is especially true when the nitridized oxide at the edges of the gate has essentially been replaced by standard oxide because the edges of the gates are crucial to hot carrier performance.

SUMMARY OF THE INVENTION

In accordance with the preferred embodiment of the present invention, a method is presented in which nitrogen-based gas in incorporated in polysilicon gate re-oxidation to improve hot carrier performance. A gate oxide layer is formed. Gate material is deposited on the gate oxide layer. The gate material is etched to form a gate structure. The gate oxide layer and the gate are re-oxidized. During re-oxidation, nitrogen-based gas is introduced to nitridize re-oxidized portions of the gate oxide layer.

The nitrogen-based gas used in re-oxidation is, for example, nitrogen oxide (NO) or nitrogen dioxide ($NO_2$).

The gate material is, for example, polysilicon. Also, in the preferred embodiment, nitrogen-based gas is introduced when the gate oxide layer is formed to nitridize the gate oxide layer.

Incorporate Nitrogen-based gas such as NO, $NO_2$, etc. at the end of the polysilicon re-oxidation cycle insures that the oxide at the oxide-silicon interface is nitridized oxide. This improves the hot carrier performance of the MOS transistor as compared to the standard polysilicon re-oxidation scheme.

DESCRIPTION OF THE PREFERRED EMBODIMENT

Figure 1:
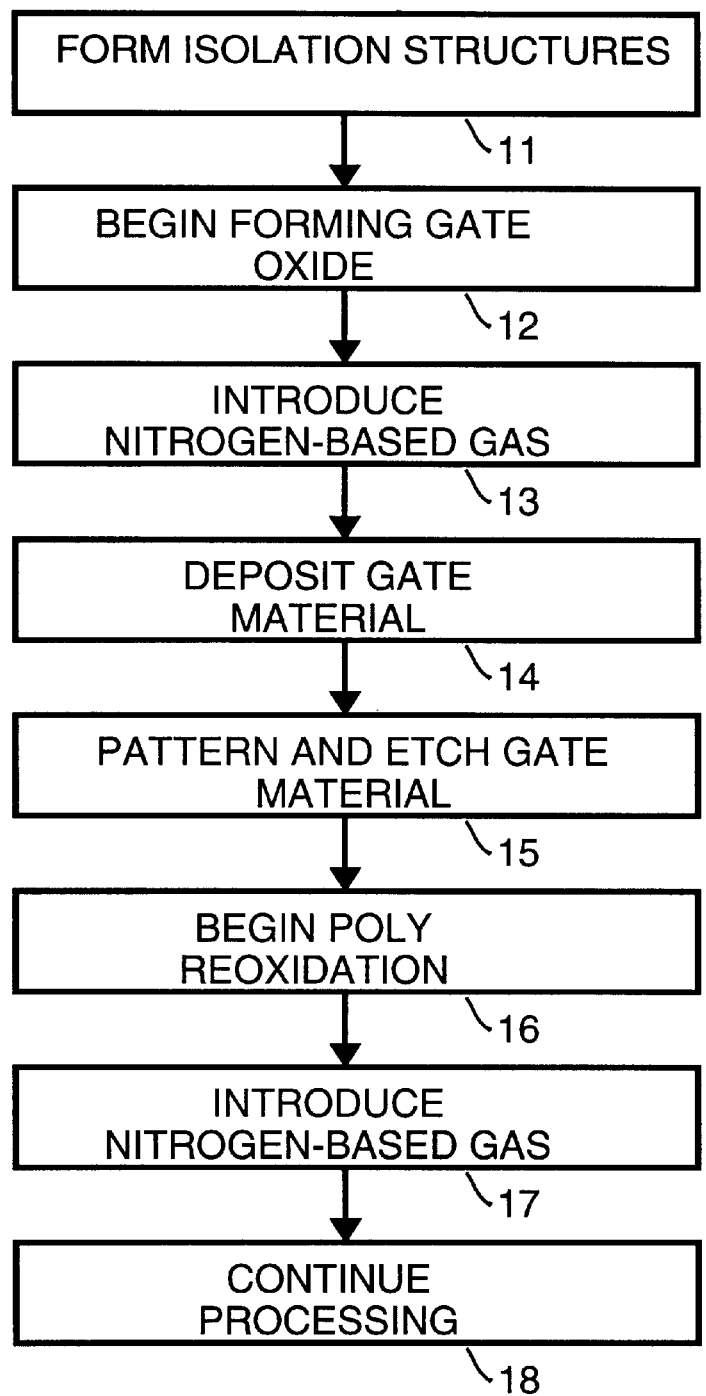
FIG. 1 is a simplified flowchart illustrating semiconductor processing in which nitrogen-based gas are incorporated in polysilicon gate re-oxidation to improve hot carrier performance in accordance with a preferred embodiment of the present invention.

FIG. 1 is a simplified flowchart for semiconductor processing in which nitrogen-based gas are incorporated in polysilicon gate re-oxidation to improve hot carrier performance. In a step 11, isolation structures are formed, as well as other additional processing dependent upon the type of semiconductor processing used and the particular structure of the end product. For example, shallow trench isolation (STI) can be used to form isolation structures.

When performing STI, a layer of buffer oxide is formed by thermal oxidation of silicon. The layer of buffer oxide is, for example, 200 Angstroms (Å) thick. A layer of nitride is formed on top of the layer of the buffer oxide. For example, the layer of nitride is formed by low pressure chemical vapor deposition (LPCVD, $SiH_2Cl_2+NH_3$.Dichlorosilane/Ammonia). The layer of nitride is, for example, 2000 Å thick. The nitride and buffer oxide is patterned by a dry etch process to define a trench area. The trench area is cleaned, for example, with wet chemicals such as sulfuric acid and hydrogen peroxide. The clean typically ends with a spin-rinse-dry (SRD). A trench is formed by, for example, performing a dry etch of the silicon wafer. The dry etch can be one or more steps to etch the silicon and smooth out the sidewall profile. The trench is filled by chemical vapor deposition (CVD) with a fill oxide so that, for an average trench width, local planarization between the trench and the nitride mask is achieved. The fill oxide is etched to a level just above the surface of the substrate. This etch is performed, for example, by a combination of chemical mechanical polish (CMP) process and a wet etch. The amount of fill oxide left above the surface of the substrate is such that future processing steps will remove/etch the remaining fill oxide, such that the remaining fill oxide will be aligned with, or slightly above the surface of the gate oxide. The nitride is stripped away, for example, by a wet etch using a "hot" phosphoric acid solution.

Instead of using shallow trench isolation (STI) to form field oxide used as an isolation structure other technologies may be used. For example, a local oxidation of silicon (LOCOS) process is often used to form field oxide regions. In a LOCOS process, a layer of pad oxide is formed. On top of the pad oxide, a layer of nitride is formed. The nitride is patterned and etched. Field oxide is grown on the substrate at places where the nitride has been etched to expose the substrate. The nitride and pad oxide are then removed.

In a step 12 and a step 13, a gate oxide layer is formed on the substrate, for example, by thermal growth. For example, in step 12, a standard oxidation cycle is used to grow the gate oxide layer to a thickness of approximately 50 Angstroms (Å). In step 13, nitrogen-based gas such as NO, or $NO_2$ is introduced at the end of the oxidation cycle to nitridize the gate oxide layer. The resulting layer of nitridized gate oxide is approximately 54 to 55 Angstroms.

Figure 2:
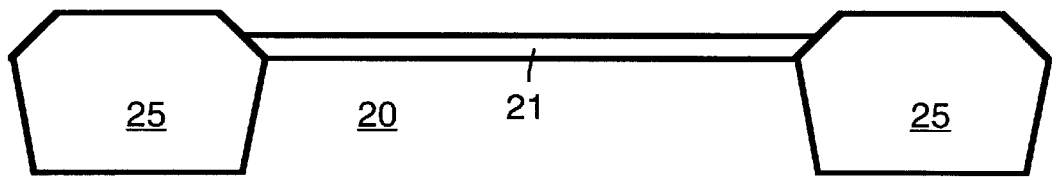
FIGS. 2, 3, 4 and 5 illustrate the semiconductor processing described in FIG. 1 in accordance with a preferred embodiment of the present invention.

For example, FIG. 2 show a layer of nitridized gate oxide 21 formed on a substrate 20. Isolation structures 25 are also shown formed within substrate 20.

Figure 3:
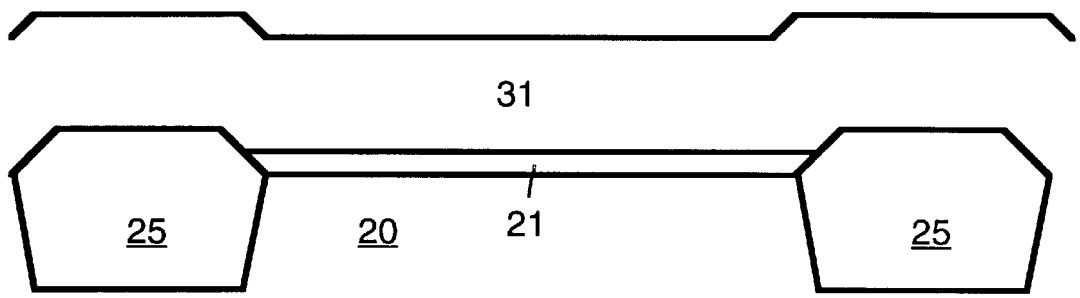

After formation of the nitridized gate oxide layer, in a step 14, a polysilicon layer is deposited. Alternatively, instead of polysilicon layer, a layer of amorphous silicon, a layer of annealed amorphous silicon or a layer of another type of gate material can be deposited. The result is illustrated by FIG. 3. In FIG. 3, a polysilicon layer 31 is shown formed over nitridized gate oxide layer 21.

Figure 4:
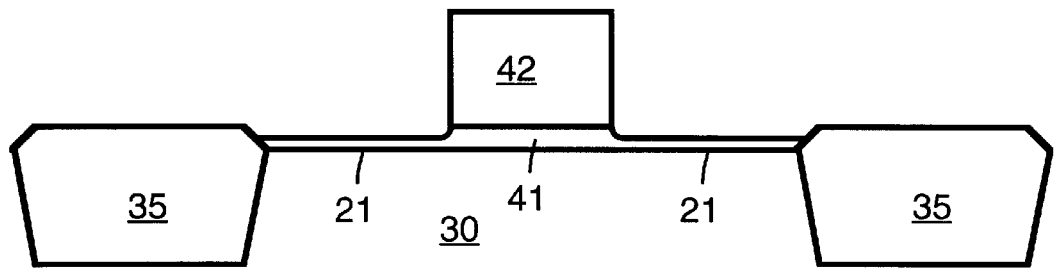

In a step 15, the polysilicon layer is patterned and etched to form a gate. While immediately under the gate, the nitridized gate oxide layer is not diminished in thickness, at other locations the width of the gate oxide layer can be reduced, for example, because of polysilicon over etch. The width of the gate oxide layer can be additionally reduced, for example, when to due to etch damage, the oxide is cleaned prior to polysilicon re-oxidation. This is illustrated by FIG. 4 where after the etch and re-oxidation pre-clean, the thickness of nitridized gate oxide layer 21 is significantly reduced, except at a region 41 directly under a gate structure 42.

In a step 16 and a step 17, polysilicon re-oxidation is performed. For example, in step 16, under a standard oxidation cycle is used to begin polysilicon re-oxidation. In a step 17, nitrogen-based gas such as NO, or $NO_2$, is introduced at the end of the oxidation cycle to insure that the oxide at the oxide-silicon interface at the edges of the gate structure is nitridized oxide. This improves the hot carrier performance of the resulting MOS transistor as compared to polysilicon re-oxidation without the use of nitrogen based gas.

For example, this is typically performed using dry oxidation. A mixture of $NO:N_2$ or $N_2O:N_2$ is introduced. The ratio of $NO:N_2$ or $N_2O:N_2$ can be in a range of a few percent to 100 percent. When NO is used, the process is performed, for example, within a temperature range of 800° to 1000°. When $N_2O$ is used, the process is performed, for example, within a temperature range of 900° to 1050°. The process time can vary from a few minutes to a longer period of time, such as 30 minutes or even 60 minutes.

Figure 5:
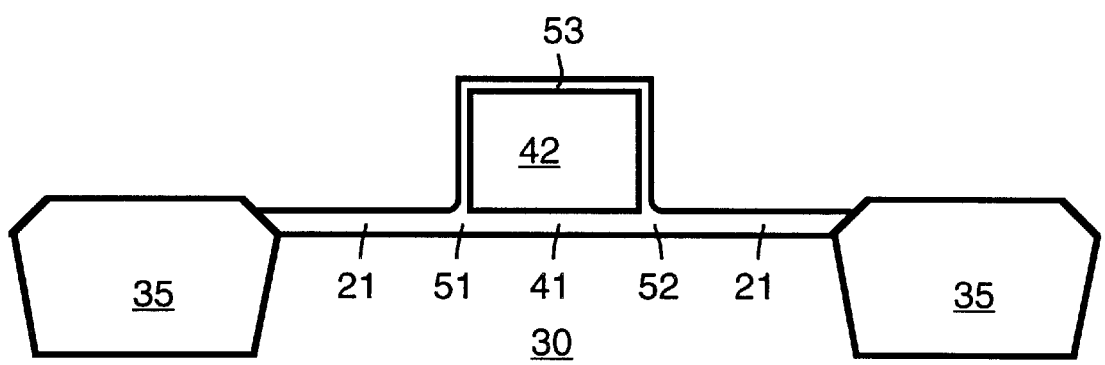

The result is illustrated by FIG. 5. In FIG. 5, re-oxidation has resulted in a thickening of nitridized gate oxide layer 21 and formation of buffer oxide 53 over gate structure 42. Nitridized oxide at corners 51 and 52 of gate structure 42 improves the hot carrier performance of the resulting MOS transistor.

In a step 18, semiconductor processing continues, depending on the particular processing type and the structures to be formed.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for forming a transistor gate structure comprising the following steps:

(a) forming a gate oxide layer;

(b) depositing gate material on the gate oxide layer;

(c) etching the gate material to form a gate structure; and, (d) re-oxidizing the gate oxide layer and the gate structure, including the following substep:

(d.1) introducing nitrogen-based gas during re-oxidation to nitridize re-oxidized portions of the gate oxide layer;

wherein step (d) is performed after completion of step (c).

2. A method as in claim 1 wherein step (a) includes:

(a.1) introducing nitrogen-based gas during formation of the gate oxide layer to nitridize the gate oxide layer.

3. A method as in claim 1 wherein in step (b) the gate material is polysilicon.

4. A method as in claim 1 wherein in substep (d.1) the nitrogen-based gas is nitrogen oxide (NO).

5. A method as in claim 1 wherein in substep (d.1) the nitrogen-based gas is nitrogen dioxide ($NO_2$).

6. A method for forming a transistor gate structure comprising the following steps:

(a) forming a gate structure on top of a gate oxide layer; and, (b) re-oxidizing the gate oxide layer and the gate structure, including the following substep:

(b.1) introducing nitrogen-based gas during re-oxidation to nitridize re-oxidized portions of the gate oxide layer;

wherein step (b) is performed after completion of step (a).

7. A method as in claim 6 wherein in step (a) the gate oxide layer is nitridized.

8. A method as in claim 6 wherein in step (a) the gate structure is composed of polysilicon.

9. A method as in claim 6 wherein in substep (b.1) the nitrogen-based gas is nitrogen oxide (NO).

10. A method as in claim 6 wherein in substep (b.1) the nitrogen-based gas is nitrogen dioxide ($NO_2$).

* * * * *